United States Patent [19]

Inoue et al.

[11] Patent Number: 5,889,678
[45] Date of Patent: Mar. 30, 1999

[54] TOPOGRAPHY SIMULATION METHOD

[75] Inventors: Soichi Inoue, Yokohama; Satoshi Tanaka, Kawasaki; Shoji Mimotogi; Yasunobu Onishi, both of Yokohama, all of Japan

[73] Assignee: Kabushiki Kaisha Toshiba, Kawasaki, Japan

[21] Appl. No.: 855,814

[22] Filed: May 12, 1997

[30] Foreign Application Priority Data

Aug. 22, 1996 [JP] Japan .................................... 8-221359

[51] Int. Cl.$^6$ ....................................................... G06F 17/50
[52] U.S. Cl. ...................... 364/488; 364/578; 364/468.04
[58] Field of Search .................................... 364/488, 489, 364/490, 491, 578, 468.04, 468.28

[56] References Cited

U.S. PATENT DOCUMENTS

| | | | |
|---|---|---|---|
| 5,067,101 | 11/1991 | Kunikiyo et al. | 364/578 |
| 5,282,140 | 1/1994 | Tazawa et al. | 364/468 |
| 5,717,612 | 2/1998 | Capodieci | 364/578 |
| 5,745,388 | 4/1998 | Mimotogi et al. | 364/578 |

OTHER PUBLICATIONS

D.A. Bernard, "Simulation of Post–Exposure Bake Effects on Photolithographic Performance of a Resist Film," *Philips Journal of Research*, vol. 42, No. 5/6, 1987, pp. 566–582.

M. Yeung, "Modeling High Numerical Aperture Optical Lithography," Proc. SPIE, vol. 922, pp. 149–167, 1988.

M. Komatsu, "Three Dimensional Resist Profile Simulation," SPIE Optical/Laser Microlithography VI. no pg. #s, 1993.

*Primary Examiner*—Kevin J. Teska
*Assistant Examiner*—Leigh Marie Garbowski
*Attorney, Agent, or Firm*—Oblon, Spivak, McClelland, Maier & Neustadt, P.C.

[57] ABSTRACT

In a topography simulation method, the topography of a resist pattern after curing treatment can be precisely estimated without producing a complex physical model or performing parameter measurement. Specifically, in the method of estimating the topography of a resist pattern, which is formed by selectively removing a part of a resist provided on a substrate and contracts due to curing treatment, the resist pattern is divided into a plurality of cells and the cells are contracted in accordance with a volume shrinkage amount per unit volume of the resist in the curing treatment. Then, the cells located closer to an interface between the substrate and the resist pattern are flattened to a higher degree in parallel to the substrate, and the deformed cells are brought together toward a shrinkage reference line passing through a center of a line pattern and toward the substrate.

10 Claims, 3 Drawing Sheets

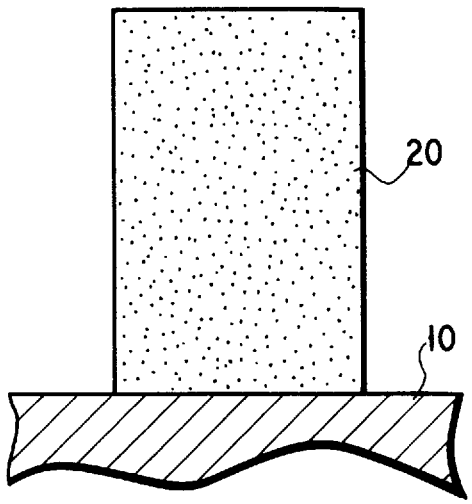
F I G. 1
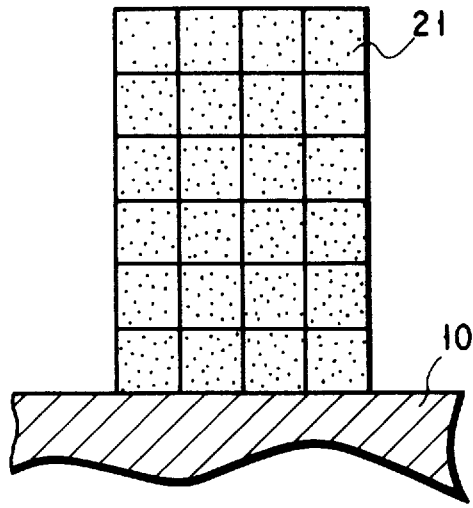
F I G. 2
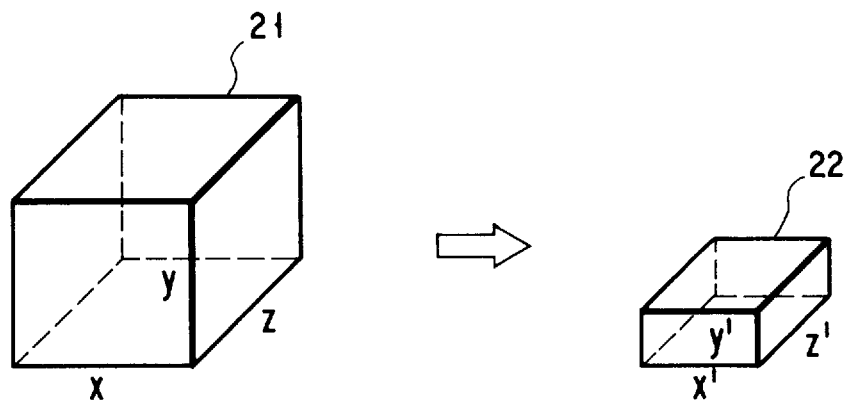
$x = y = z$
$x \cdot y \cdot z = V_0$
$x' = z'$
$x' \cdot y' \cdot z' = V$
$V/V_0 = R(T, t)$  (R: VOLUME SHRINKAGE RATIO)
F I G. 4

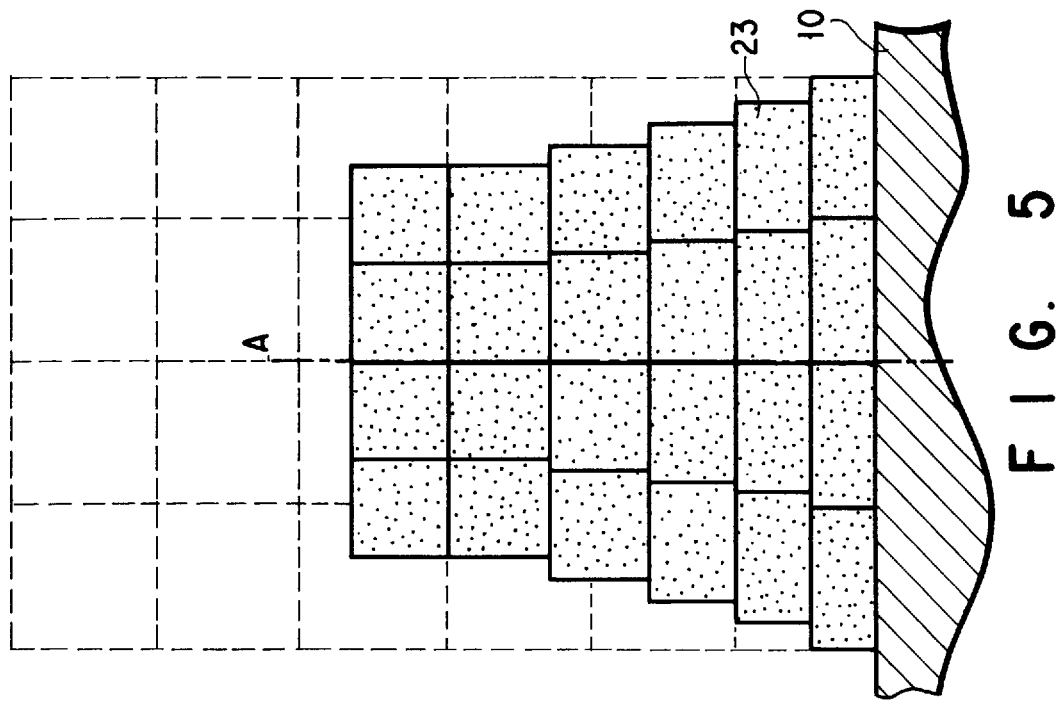
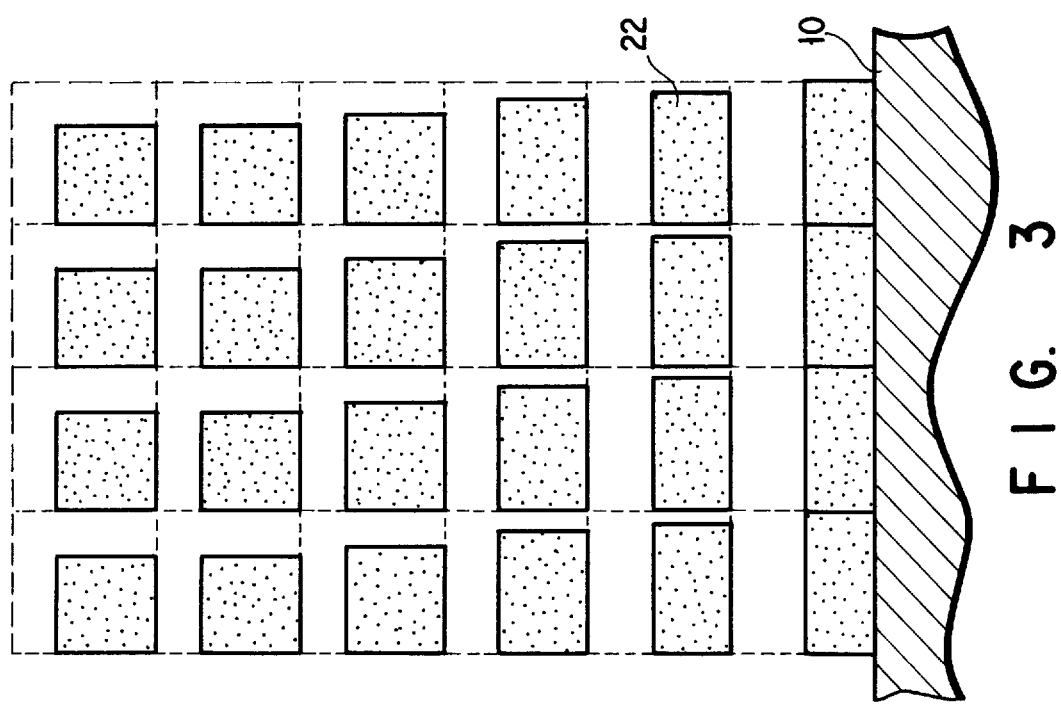

TOPOGRAPHY SIMULATION METHOD

BACKGROUND OF THE INVENTION

The present invention relates generally to a topography simulation technique and more particularly to a topography simulation method for estimating a topography of a fine resist pattern which will be formed by selectively removing a part of a resist closely attached to a substrate and will then contract in a post-treatment step, and to a storage medium storing a program for carrying out this simulation method.

With recent development in shrinkage of LSIs, the resolution of lithography has almost reached a limit and it has become necessary to exactly estimate the resolution of lithography. The resolution in lithography depends on optical factors, but the superiority of the resolution in lithography determines whether a resist pattern significant in a subsequent step of etching, etc. can be provided.

Thus, when the resolution of lithography is estimated, it is conventionally necessary to simulate not only an image obtained by an exposure tool, but also photosensitization of a resist, post exposure baking (PEB), development, etc.

In general, an imaging model by a partially coherent optical system, proposed by Hopkins, Yeung, etc., is used as an imaging model by an optical system, and it is said that such imaging model has high precision. Photo-sensi models of novolak-based resists have been proposed by Dill, Mack, etc. There are many proposals regarding chemical amplified type resists. In addition, models of Fick, etc. have been proposed with respect to diffusion of a photo-active compound due to PEB. A string model, cell removal model, level set method model, etc. have been proposed as development models for effecting development in accordance with a photo-active compound distribution of a resist, which is calculated on the basis of the above models.

As stated above, the resist topography can be estimated with high precision by the imaging, photo-sensitization and development models. However, in the case of etching or ion doping, durability of a resist pattern needs to be increased by curing by means of UV radiation, hard baking, etc.

A resist pattern contracts and deforms due to curing treatment for increasing durability thereof. Consequently, an actual resist pattern topography differs from a topography obtained by resist development simulation.

In order to exactly simulate a resist pattern topography obtained after curing treatment such as hard baking, it is necessary to formulate causes of topography deformation due to contraction of the resist and to measure each parameter. It is, however, very difficult and time-consuming to produce complex physical models and measure parameters.

As has been described above, in the prior art, there is a problem in that a pattern topography of a resist used in etching or ion doping, which resist is patterned by photo-sensitization and development and then subjected to post-treatment, differs from a resist pattern topography obtained by resist development simulation because of deformation due to contraction in the post-treatment.

In order to simulate a resist pattern topography after the post-treatment, it is necessary to produce complex physical models and measure parameters.

BRIEF SUMMARY OF THE INVENTION

The present invention has been made in consideration of the above circumstances, and an object thereof is to provide a topography simulation method capable of exactly estimating, with a simple calculation procedure, the topography of a resist pattern after post-treatment, without producing a complex physical model or performing parameter measurement.

Another object of the present invention is to provide a storage medium storing a program for carrying out the above simulation method.

In order to achieve the above objects, the present invention has the following constitutional features.

In a method of estimating the topography of a resist pattern, which is formed by selectively removing a part of a resist closely attached to a substrate and contracts due to curing treatment, the resist pattern is divided into a plurality of cells and the cells are contracted in accordance with a volume shrinkage amount per unit volume of the resist in the curing treatment. Then, the cells located closer to an interface between the substrate and the resist pattern are flattened to a higher degree in parallel to the substrate, and the deformed cells are brought together at desired locations and toward the substrate.

Preferable modes of carrying out the present invention are as follows:

(1) A resist pattern is divided into a plurality of cubic cells, (2) The cells are contracted according to an equal volumetric shrinkage amount, regardless of the positions thereof, (3) The deformed cells are brought together toward a shrinkage reference line passing through a center of a resist pattern and toward the substrate.

(4) Post-treatment is heating, or radiation of electromagnetic waves or charged particles, and (5) A program for carrying out the simulation under control by a computer is stored in a storage medium such as a magnetic disk, an optical disk or a semiconductor memory.

When a resist pattern is subjected to curing treatment such as UV radiation or hard baking, the resist pattern will shrink and deform. The cause of decrease in volume is, for example, decomposition of naphthoquinone diazide, cross-link of a polymer due to the decomposition, volatilization of a solvent, etc.

These factors cause a variation in volume. If the adhesion between the resist pattern and the substrate is strong, the direction of contraction near the interface between the resist pattern and substrate is limited while the portion of the resist away from the interface contracts relatively uniformly. Thus, the topography of the resist is determined in the state in which an internal stress distribution is balanced.

It is very difficult to produce a physical model and measure necessary parameters by finding the factors which will cause a variation in shape due to the above-mentioned contraction of the resist.

In the present invention, the resist pattern is divided into small cells, and the variation in shape itself is measured separately. The measured variation amount is converted to a variation amount of each fine cell. Thus, the topography of the contracted resist pattern is simulated.

Thereby, the topography of the contracted resist pattern can be precisely estimated by a simple calculation method, without producing a complex physical model or performing parameter measurement.

According to a first aspect of the present invention, there is provided a topography simulation method for simulating a cross-sectional topography of a resist pattern after curing treatment, the method comprising:

a first step of converting first data representing a cross section of a resist pattern on a substrate before the resist pattern is subjected to the curing treatment, to second data representing a topography of cross section which has been divided into a plurality of cells;

a second step of converting the second data to third data representing the plurality of cells deformed in accordance with a predetermined volumetric shrinkage ratio and a predetermined flatness ratio such that the cells located closer to an interface between the substrate and resist pattern are flattened to a higher degree in parallel to the substrate; and a third step of converting the third data to fourth data showing a topography defined by bringing together the deformed cells at desired locations.

According to a second aspect of the invention, there is provided a computer program product for operating a computer, the computer program product comprising:

a computer readable medium;

first program instruction means for instructing a computer processor to convert first data representing a cross section of a resist pattern on a substrate before the resist pattern is subjected to curing treatment, to second data representing a topography of cross section which has been divided into a plurality of cells;

second program instruction means for instructing the computer processor to convert the second data to third data representing the plurality of cells deformed in accordance with a predetermined volumetric shrinkage ratio and a predetermined flatness ratio such that the cells located closer to an interface between the substrate and the resist pattern are flattened to a higher degree in parallel to the substrate; and third program instruction means for instructing the computer processor to convert the third data to fourth data showing a topography defined by bringing together the deformed cells at desired locations, wherein each of the program instruction means is recorded on the medium in excutable form and is loadable into the computer for execution by the processor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows a simulation result relating to a cross-section of a developed resist pattern;

FIG. 2 shows a state in which a cross-section of a resist pattern is divided into cubic cells;

FIG. 3 shows a state in which small cells have been contracted according to a volumetric shrinkage ratio R;

FIG. 4 is a view for explaining contraction of a small cell;

FIG. 5 shows a simulation result of the topography of a resist pattern which has been subjected to post baking;

DETAILED DESCRIPTION OF THE INVENTION

Figure 6:
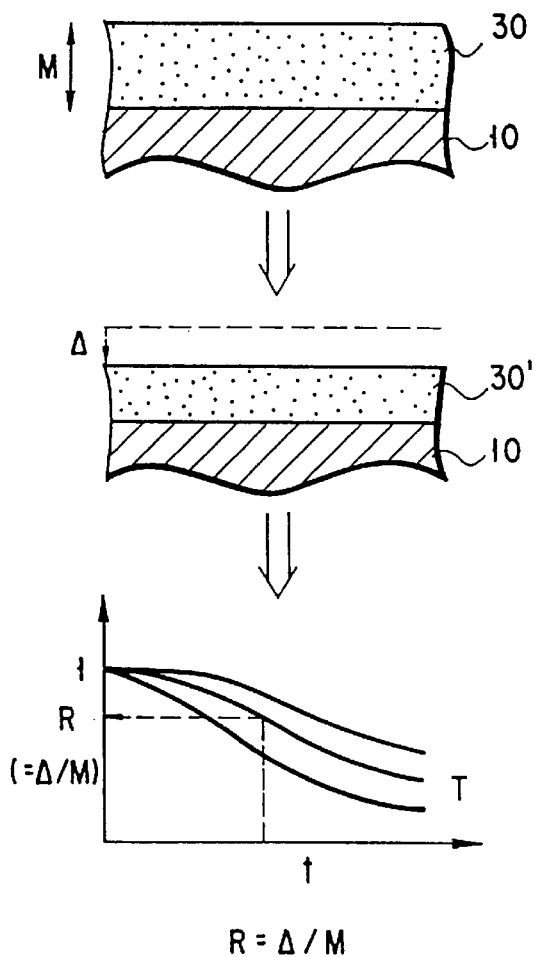
FIG. 6 illustrates a procedure for finding a volumetric shrinkage ratio.

Embodiments of the present invention will now be described with reference to the accompanying drawings.

(First Embodiment)

FIG. 1 shows a simulation result of a cross section of a resist pattern. In this simulation, a photomask pattern is transferred onto a wafer coated with a resist by a projecting exposure tool, and then the resist is subjected to PEB (Post Exposure Baking) and development. The resist pattern is an isolated line pattern.

The exposure light wavelength in this projecting exposure tool was 365 nm (i-line), the numerical aperture (NA) of a projecting optical system of the exposure tool was 0.57, and the coherence factor of the light source was 0.6. The photomask pattern was an isolated line of a light-shielding element, and the width of the isolated line was 0.4 $\mu$gm in terms of a value calculated on the basis of the dimensions of the wafer.

The light-shielding element had a two-layer structure comprising a chromium (Cr) layer and a chromium oxide layer. The resist was a novolak-based positive-type resist, and the thickness M thereof was 1.0 $\mu$m. The complex reflection index thereof was n=1.7, k=0.014.

The diffusion coefficient D of a PAC (Photo-Active Compound) at the time of PEB treatment was 0.01. The dissolution rate characteristics of the resist were measured separately by a DRM (dissolution rate monitor). Based on the measured result, a dissolution rate curve was obtained, in which a resist film thickness was plotted for each exposure amount in relation to an exposure time.

The Yeung's algorithm was used in the imaging simulation by the projecting exposure tool (M. Yeung, "Modeling High Numerical Aperture Optical Lithography", Proc. SPIE, vol. 922, pp. 149–167, 1988).

A latent image distribution on the resist, which was obtained by this algorithm, was convoluted by using a Gaussian function corresponding to a diffusion coefficient D. Thus, a distribution of the PAC, in which the influence of diffusion of the PAC due to PEB was considered, was obtained. Then, the PAC distribution was converted to a dissolution rate distribution by using the dissolution rate curve.

Based on this dissolution rate distribution, the resist pattern cross section after development, as shown in FIG. 1, was obtained by a modified diffusion method (M. Komatsu, "Three Dimensional Resist Profile Simulation", SPIE Optical/Laser Microlithography VI, p. 413, 1993). In FIG. 1, numeral 10 denotes a substrate as an underlying layer, and numeral 20 a resist pattern.

Figure 7:
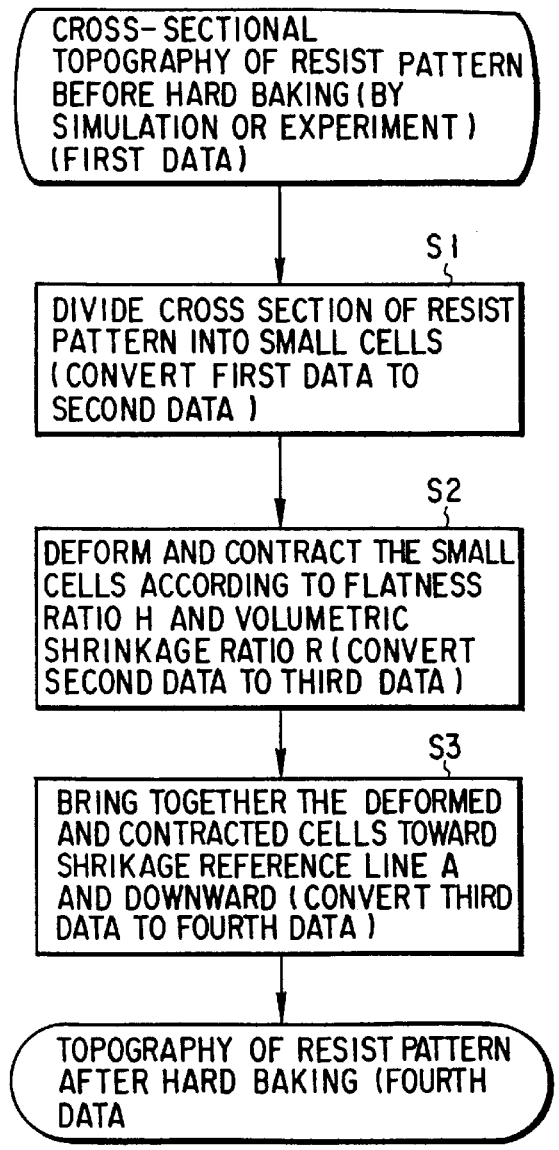
FIG. 7 is a flow chart illustrating a topography simulation method according to an embodiment of the present invention.

A method of simulating the shape of a resist pattern after hard baking, according to the embodiment of the invention, will now be described with reference to a flow chart of FIG. 7.

As mentioned above, a cross-sectional topography of a resist pattern before hard baking treatment is obtained.

Then, as shown in FIG. 2, the cross section of the resist pattern is divided into small cubic cells 21 (step S1). Specifically, first data representing the cross section of the resist pattern on the substrate before hard baking treatment is converted to second data representing the cross section divided into the cells.

The small cells are contracted according to a volumetric shrinkage ratio R, as shown in FIG. 3 (step S2). Specifically, the second data is converted to third data representing a plurality of cells deformed in accordance with predetermined volumetric shrinkage ratio and flatness ratio such that cells closer to the interface between the substrate and resist pattern are flattened to a higher degree in parallel to the substrate.

In FIGS. 2 and 3 numeral 21 denotes each small cell before shrinkage, and numeral 22 each small cell after shrinkage.

In this case, cells closer to the interface between the resist and substrate have rectangular shapes more elongated in parallel to the substrate, and cells away from the interface have shapes closer to squares.

The volume of each contracted cell is set at a fixed value V, irrespective of the position thereof, as shown in FIG. 4. The value V is obtained from the volume shrinkage ratio R which is a function of hard bake temperature T and hard bake time t. If the cell volume before contraction is Vo, the value V is given by $$V = V_O \cdot R(T,t) \tag{1}$$

In FIG. 4, x is the width, y is the height and z is the depth of the cell 21 shown in FIG. 2. On the other hand, x' is the width, y' is the height and z' is the depth of the cell 22 shown in FIG. 3.

A cell flatness ratio H expressing the relationship between the degree of flatness of the small cell and the distance between the small cell and the interface between the substrate and resist was fitted by a method, as described later. Then, as shown in FIG. 5, the deformed small cells 23 are brought together toward a shrinkage reference line A passing through the center of the line pattern and downward (toward the substrate) (step S3).

Specifically, the third data is converted to fourth data representing a shape of a mass of the deformed cells brought together toward the shrinkage reference line A passing through the center of the line pattern and downward (toward the substrate).

Thus, the shape of the contracted resist pattern is obtained.

In other words, the cross-sectional shape of the resist pattern after hard baking can be simulated on the basis of the fourth data.

The volumetric shrinkage ratio R and cell flatness ratio H were obtained by experiments through the following procedures.

FIG. 6 illustrates the procedure for obtaining the volume shrinkage ratio R. A positive-type resist 30 assumed by the above-described simulation is coated on the substrate 10 to a thickness M. The resist 30 is subjected to PEB, development processing and then hard baking, without exposure.

Numeral 30' denotes a hard-baked resist. A resist film thickness decrease Δ (T, t) in relation to hard bake temperature T and hard bake time t was measured and the volumetric shrinkage ratio R=Δ/M was obtained.

The resist film thickness was measured by cross-sectional SEM observation of the wafer. Alternatively, optical constants before and after hard baking may be measured to optically measure the film thickness. Besides, a contact-type step measuring device or AFM may be used. The volumetric shrinkage ratio R was obtained by the above method.

A resist pattern was actually formed under the same conditions as were used in the above simulation, and the cross-sectional shapes of the resist pattern before and after the hard baking were measured. Thus, the cell flatness ratio H of the cell of interest in relation to the distance from the interface between the substrate and resist was obtained by fitting. This method will now be described.

In a cross-sectional shape of a resist pattern before hard baking, which is approximated by a mass of cells, the number f(j) of j-th cells ($0 \leq j \leq m$) as counted from the substrate is given by $$f(j) = \sum_{k=0}^{p} a_k j^k \tag{2}$$

An approximated shape F(j) of the actual resist pattern before hard baking, which is expressed by a mass of cells, and the height h of the resist pattern are given by $$F(j) = d \times f(j) = d \times \sum_{k=0}^{p} a_k j^k \tag{3}$$

where d is the length of one side of a cubic cell.

The polynominal coefficient $a_k$ is obtained by fitting.

If the width, height and depth of the j-th cell, as counted from the hard-baked substrate, are x(j), y(j) and z(j), x(j)=z(j) in the present embodiment. Since the volume of the contracted cell is set at substantially fixed value (V) irrespective of value j, the dependency of x(j) and y(j) upon j is expressed by $$x(j) = \sum_{g=0}^{q} b_g j^{2g} \tag{5}$$

$$y(j) = V/x(j)^2 = V/\left\{\sum_{g=0}^{q} b_g j^{2g}\right\}^2 \tag{6}$$

From equation (1), the flatness ratio H is given by $$H = y(j)/x(j) = V/\left\{\sum_{g=0}^{q} b_g j^{2g}\right\}^3 \tag{7}$$

$$= V_0 \cdot R(T, t)/\left\{\sum_{g=0}^{q} b_g j^{2g}\right\}^3 \tag{8}$$

Since the number of cells is unchanged before and after hard baking, an approximated shape F'(j) of the actual resist pattern after hard baking, which is expressed by the mass of cells, and the height h' of the resist pattern are given by $$F'(j) = x(j) \times f(j) = \sum_{g=0}^{q} b_g j^{2g} \times \sum_{k=0}^{p} a_k j^k \tag{9}$$

$$h' = \sum_{j=0}^{m} y(j) = \sum_{j=0}^{m} V/\left\{\sum_{g=0}^{q} b_g j^{2g}\right\}^2 \tag{10}$$

The polynominal coefficient $b_g$ is obtained by fitting. From equation (8), the flatness ratio H was obtained. Specifically, a pattern profile before and after hard baking was subjected to equal series expansion, and a coefficient thereof was fitted to find the flatness ratio H.

According to the present embodiment, by using the above process, the shape of a hard-baked resist pattern can be exactly estimated.

In this case, the volumetric shrinkage ratio R per unit volume, which is a required parameter, was obtained through experiments by measuring the shrinkage amount of the flat resist film in the hard baking step, under the supposition that the volumetric shrinkage ratio R per unit volume is constant regardless of the position in the thickness direction of the resist.

On the other hand, the flatness ratio, which is another required parameter, was obtained by measuring the actual resist pattern shape before and after hard baking and converting the variation amount in the resist pattern shape to a variation amount in each small cell.

Thereby, the shape of the contracted resist pattern can be precisely simulated by a simple calculation method, without producing a complex physical model or performing parameter measurement.

According to the present embodiment, the precision in simulation in subsequent steps such as ion doping and etching can be enhanced.

Furthermore, since an actual variation in resist pattern line width due to deformation of the resist can be found in advance, the dimensions of the photomask can be corrected properly.

(Second Embodiment)

A topography simulation method according to a second embodiment of the present invention will now be described.

The calculation steps up to the formation of the resist pattern are the same as those in the first embodiment. The calculation steps in the hard baking illustrated in FIGS. 1, 2, 3 and 5 are also the same. The second embodiment differs from the first embodiment with respect to the steps of finding the volumetric shrinkage ratio and flatness ratio of the cells.

In the first embodiment, the volumetric shrinkage ratio and flatness ratio were found under the supposition that the volumetric shrinkage ratio of the cell is constant regardless of the position in the thickness direction of the resist.

By contrast, in the second embodiment, it is not supposed that the volumetric shrinkage ratio of the cell is constant regardless of the position in the thickness direction of the resist. In this case, if the width, height and depth of the j-th cell, as counted from the hard-baked substrate, are $x(j)$, $y(j)$ and $z(j)$, $x(j)=z(j)$ in the present embodiment. Since the volume of the contracted cell is set at substantially fixed value (V) irrespective of value j, the dependency of $x(j)$ and $y(j)$ upon j is expressed by $$x(j) = \sum_{g=0}^{q} b_g j^{2g} \qquad (11)$$

$$y(j) = \sum_{g'=0}^{q'} c_{g'} j^{2g'} \qquad (12)$$

The flatness ratio H is given by $$H = y(j)/x(j) = \sum_{g'=0}^{q'} c_{g'} j^{2g'} / \sum_{g=0}^{q} b_g j^{2g} \qquad (13)$$

Since the number of cells is unchanged before and after hard baking, an approximated shape F'(j) of the actual resist pattern after hard baking, which is expressed by the mass of cells, and the height h' of the resist pattern are given by $$F'(j) = x(j) \times f(j) = \sum_{g=0}^{q} b_g j^{2g} \times \sum_{k=0}^{p} a_k j^k \qquad (14)$$

$$h' = \sum_{j=0}^{m} y(j) = \sum_{j=0}^{m} \left\{ \sum_{g'=0}^{q'} c_{g'} j^{2g'} \right\} \qquad (15)$$

The polynominal coefficients $b_g$ and $c_g$ were obtained by fitting. From equation (13), the flatness ratio H was obtained.

In each of the above-described two embodiments, the ratio of the time from the beginning of the hard baking to the entering of the normal state to the total hard baking time is large. If the temperature variation in that time period is not ignorable, the hard baking can be simulated in real time by "in-situ" monitoring the decrease in film thickness in an initial hard baking time for each final set temperature.

The topography of a three-dimensional resist pattern after hard baking can be calculated by properly setting the shrinkage reference line A and also by properly determining the three dimensions $x(j)$, $y(j)$ and $z(j)$ of the contracted cell.

The present invention is not limited to the above embodiments, and various modifications can be made without departing from the spirit of the invention.

In the present embodiment, the resist pattern is divided into cubic cells. However, the resist pattern may be divided into cells of other topographies. The location of the shrinkage reference line is not necessarily limited to the center of the line pattern, and may be altered according to the shape of the resist pattern, on an as-needed basis. The post-treatment is not limited to the heating treatment such as hard baking, and may be radiation of electromagnetic waves or charged particles.

The methods according to the embodiments of the invention may be stored, in the form of computer-processible programs, in storage media such as magnetic disks (floppy disks, hard disks, etc.), optical disks (CD-ROMs, DVDs, etc.) and semiconductor memories, and the storage media storing such programs may be distributed As has been described above in detail, according to the present invention, a resist pattern is divided into a plurality of cells, and each cell is contracted in accordance with a volumetric shrinkage amount per unit volume of the resist due to post-treatment. In this case, cells closer to the interface between the substrate and the resist have shapes more flattened in parallel to the substrate, and the deformed cells are brought together to desired positions and toward the substrate. Thus, the topography of the resist pattern after post-treatment can be precisely estimated by a simple calculation method, without producing a complex physical model or performing parameter measurement.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A topography simulation method for simulating a cross-sectional topography of a resist pattern after curing treatment, the method comprising:

a first step of converting first data representing a cross section of a resist pattern on a substrate before the resist pattern is subjected to the curing treatment, to second data representing a topography of cross section which has been divided into a plurality of cells;

a second step of converting the second data to third data representing the plurality of cells deformed in accordance with a predetermined volumetric shrinkage ratio and a predetermined flatness ratio such that the cells located closer to an interface between the substrate and resist pattern are flattened to a higher degree in parallel to the substrate; and a third step of converting the third data to fourth data showing a topography defined by bringing together the deformed cells at desired locations.

2. The topography simulation method according to claim 1, wherein in the second step the volume of the cells before the deformation is equal to that of the cells after the deformation.

3. The topography simulation method according to claim 1, wherein in the second step the volume of the cells before the deformation differs from that of the cells after the deformation.

4. The topography simulation method according to claim 1, wherein in the first step the shape of each of the divided cells is cubic.

5. The shape simulation method according to claim 1, wherein in the third step, the plurality of deformed cells are brought together toward the interface between the substrate and the resist pattern and toward a center line indicating a center of a line of the resist pattern before the curing treatment.

6. A computer program product for operating a computer, said computer program product comprising:

a computer readable medium;

first program instruction means for instructing a computer processor to convert first data representing a cross section of a resist pattern on a substrate before the resist pattern is subjected to curing treatment, to second data representing a topography of cross section which has been divided into a plurality of cells;

second program instruction means for instructing the computer processor to convert the second data to third data representing the plurality of cells deformed in accordance with a predetermined volumetric shrinkage ratio and a predetermined flatness ratio such that the cells located closer to an interface between the substrate and the resist pattern are flattened to a higher degree in parallel to the substrate; and third program instruction means for instructing the computer processor to convert the third data to fourth data showing a topography defined by bringing together the deformed cells at desired locations, wherein each of said program instruction means is recorded on said medium in excutable form and is loadable into the computer for execution by the processor.

7. The computer program product as set forth in claim 6, wherein in said second program instruction means, the volume of the cells before the deformation is equal to that of the cells after the deformation.

8. The computer program product as set forth in claim 6, wherein in said second program instruction means, the volume of the cells before the deformation differs from that of the cells after the deformation.

9. The computer program product as set forth in claim 6, wherein in said first program instruction means, the topography of each of the divided cells is cubic.

10. The computer program product as set forth in claim 6, wherein in said third program instruction means, the plurality of deformed cells are brought together toward the interface between the substrate and the resist pattern and toward a center line indicating a center of a line of the resist pattern before the curing treatment.

* * * * *